(12) United States Patent
Liang (10) Patent No.: US 11,632,865 B1
(45) Date of Patent: Apr. 18, 2023

(54) MOUNTING DEVICE FOR MOUNTING ELECTRONIC PRODUCT

(71) Applicant: AMBIT MICROSYSTEMS (SHANGHAI) LTD., Shanghai (CN)

(72) Inventor: Jen-Yu Liang, New Taipei (TW)

(73) Assignee: AMBIT MICROSYSTEMS (SHANGHAI) LTD., Shanghai (CN)

( * ) Notice: Subject to any disclaimer, the term of this patent is extended or adjusted under 35 U.S.C. 154(b) by 45 days.

(21) Appl. No.: 17/511,746

(22) Filed: Oct. 27, 2021

(51) Int. Cl.
*H05K 5/02* (2006.01)
*F16M 13/02* (2006.01)

(52) U.S. Cl.
CPC ......... *H05K 5/0204* (2013.01); *F16M 13/027* (2013.01)

(58) Field of Classification Search
CPC ..... F16M 13/02; F16M 13/027; H05K 5/0204
See application file for complete search history.

(56) References Cited

U.S. PATENT DOCUMENTS

| | | | | |
|---|---|---|---|---|
| 2008/0105803 | A1* | 5/2008 | Tu | H05K 5/0204 248/220.22 |
| 2022/0390062 | A1* | 12/2022 | Lien | F16M 13/005 |

FOREIGN PATENT DOCUMENTS

| | | | |
|---|---|---|---|
| CN | 112703828 | A | 4/2021 |
| CN | 112997592 | A | 6/2021 |
| CN | 113490385 | A | 10/2021 |
| JP | WO-2008068946 | A1 * | 12/2008 |
| TW | M307280 | U * | 3/2007 |
| TW | M307280 | U | 3/2007 |
| TW | I577914 | B * | 4/2017 |
| TW | I577914 | B | 4/2017 |
| TW | M618039 | U | 10/2021 |

OTHER PUBLICATIONS

Motorola AP-6521 Access Point 2013 installation manual (Year: 2013).*

* cited by examiner

*Primary Examiner* — Terrell L McKinnon
*Assistant Examiner* — Ding Y Tan
(74) *Attorney, Agent, or Firm* — ScienBiziP, P.C.

(57) ABSTRACT

A mounting device includes a housing, a sliding structure, and a switch structure. The housing includes two tracks, an elastic element including a blocking rib, and a first clamping element. The sliding structure is movably disposed in the tracks and includes a second clamping element and a reverse rib. The switch structure is movably disposed on the sliding structure and includes a forward rib. When the sliding structure is in the installed position, a support frame is fastened between the first clamping element and the second clamping element, and the blocking rib prevents the sliding structure moving relative to the housing. When the switch structure is moved in a detaching direction, the forward rib pushes the blocking rib away from the reverse rib, to allow the sliding structure to move in the detaching direction relative to the housing.

10 Claims, 10 Drawing Sheets

MOUNTING DEVICE FOR MOUNTING ELECTRONIC PRODUCT

FIELD

The subject matter herein generally relates to mountings for electronic products.

BACKGROUND

Wireless communication devices can provide network communication. Generally, the communication devices are mounted on support frames by mounting devices mounted on the ceiling for example.

However, the structure of conventional mounting devices is complicated, resulting in high pricing. In addition, the process of assembling the mounting devices is complex, which increases the difficulty of the user in assembling or disassembling the mounting devices. Consequently, it would be desirable to provide a solution for improving mounting devices.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

The term "connected" is defined as directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

Figure 1:
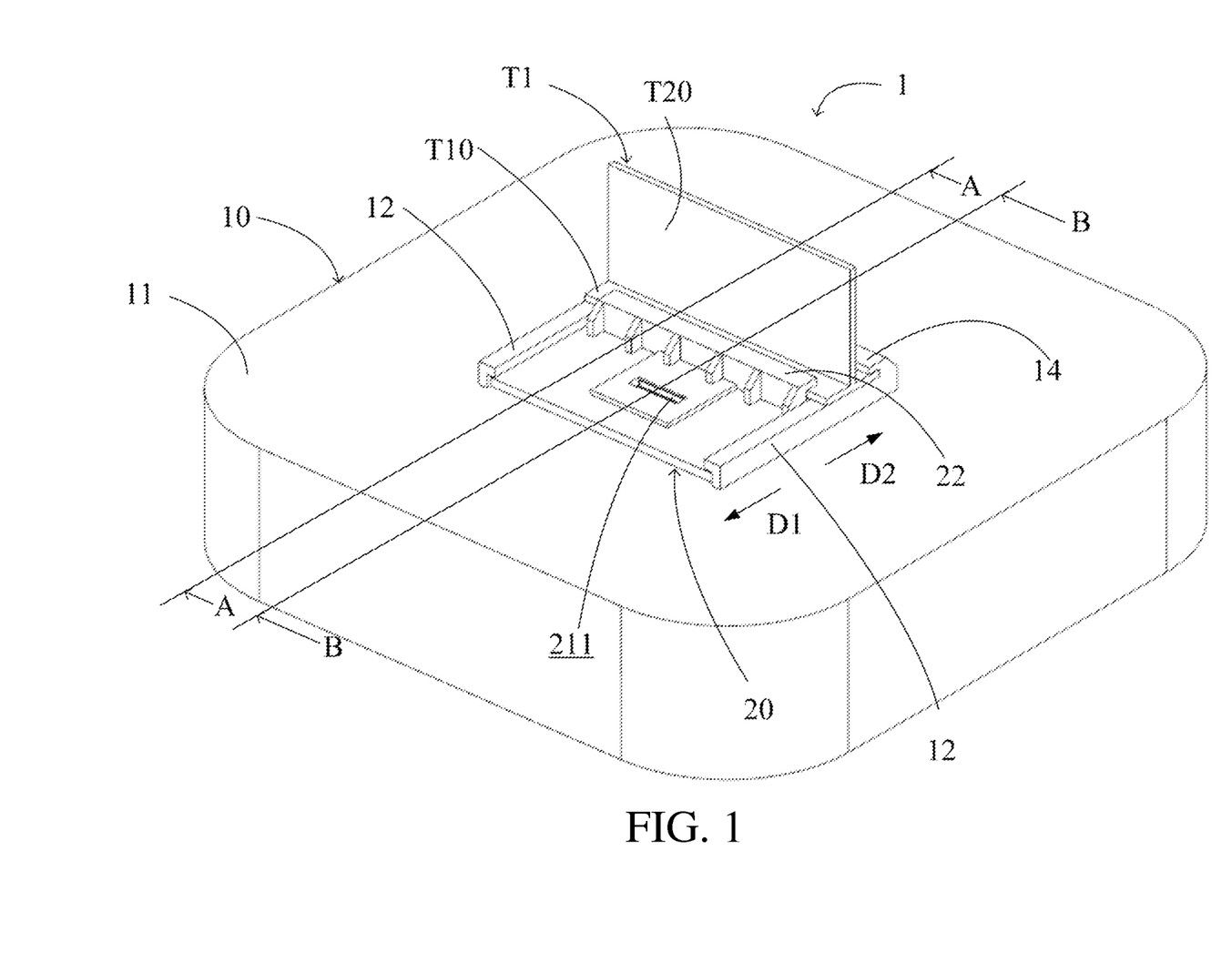
FIG. 1 is a perspective view of a mounting device in one embodiment of the present disclosure.
Figure 2:
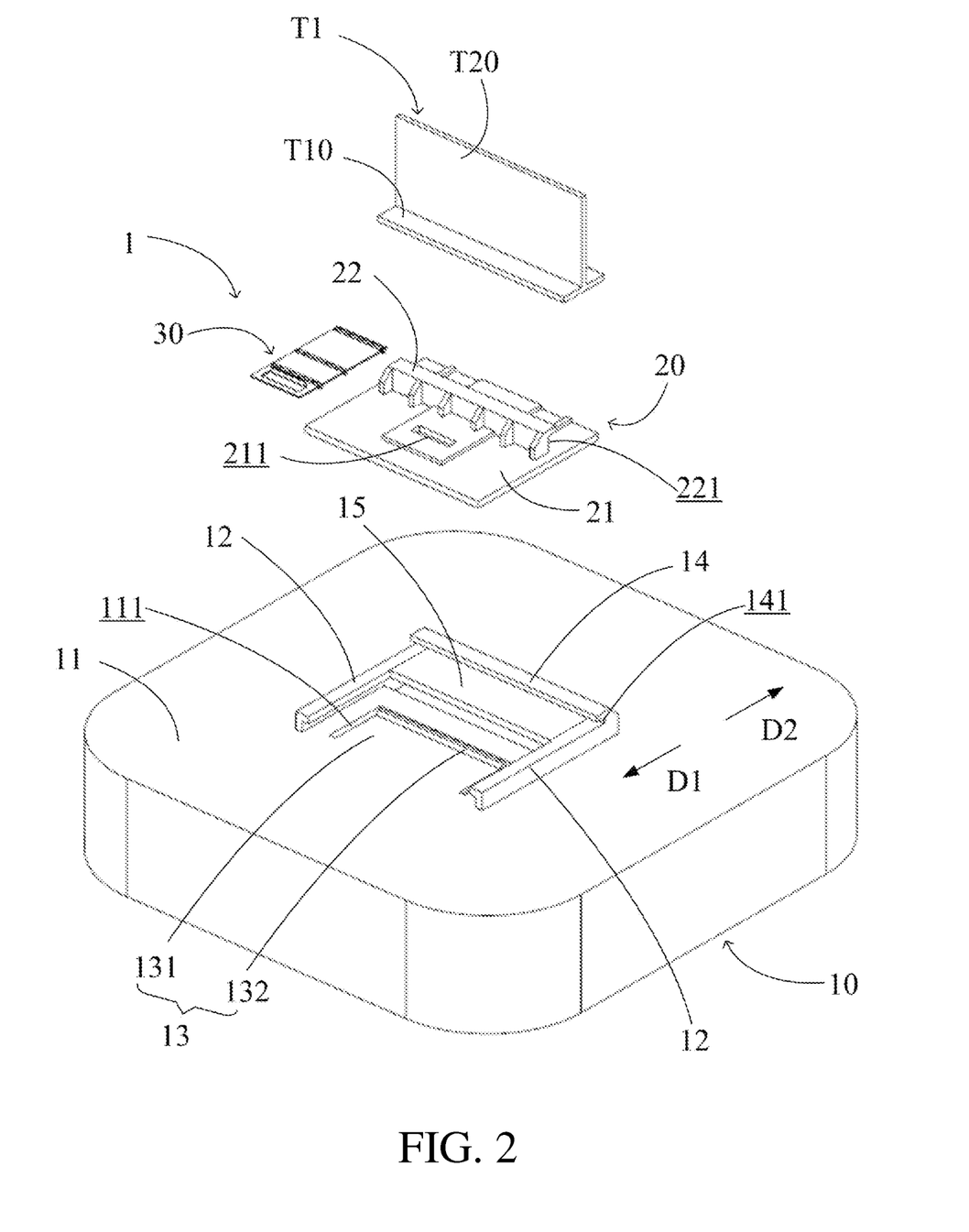
FIG. 2 is an exploded view of the mounting device of FIG. 1.
Figure 3:
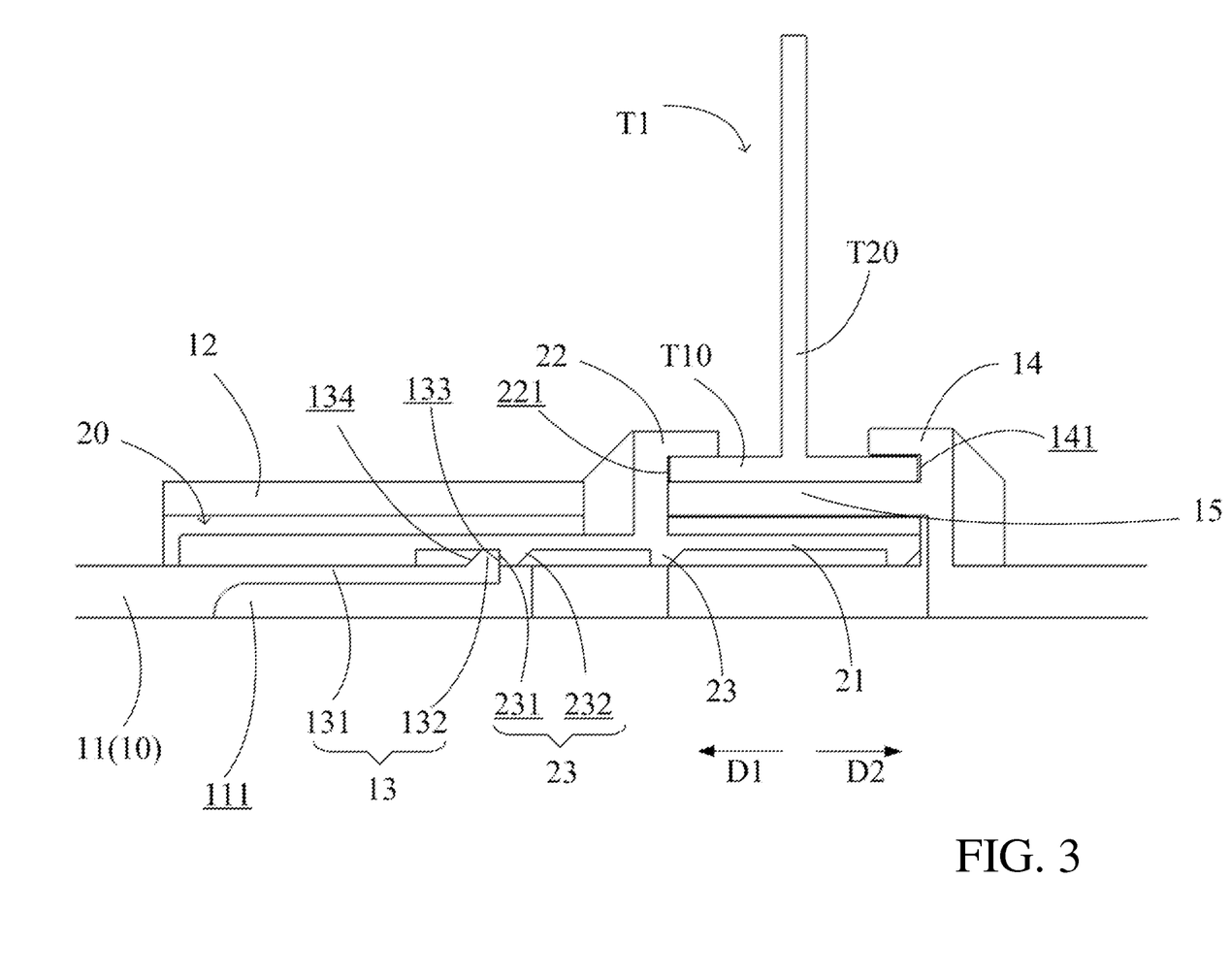
FIG. 3 is a cross-sectional view of line AA of FIG. 1.

FIG. 1 is a perspective view of a mounting device 1 in one embodiment of the present disclosure. FIG. 2 is an exploded view of the mounting device 1 of FIG. 1. FIG. 3 is a cross-sectional view of line AA of FIG. 1. The mounting device 1 of the present disclosure is integrated into an electronic device. In other words, the mounting device 1 can be an electronic device with mounting function. The mounting device 1 is detachably mounted on a support frame T1. The support frame T1 is an elongated structure and extends in the horizontal direction. In this embodiment, the support frame T1 is a T-shaped structure, and includes a horizontal board T10 and a vertical board T20. The horizontal board T10 and the vertical board T20 extend perpendicular to a detaching direction D1. The vertical board T20 is connected to the center of the horizontal board T10 and is perpendicular to the horizontal board T10. In one embodiment, the horizontal board T10 of the support frame T1 can support decorative plates, which form part of a ceiling. In other words, the mounting device 1 is mounted on the ceiling by the support frame T1. In another embodiment, the mounting device 1 is mounted on a wall by the support frame T1.

The mounting device 1 includes a housing 10, a sliding structure 20, and a switch structure 30. The housing 10 is a housing of an electronic device. The electronic device may be a wireless router, or a projector, not being limited thereto. Electronic components such as a chip, a memory, and/or a main board are disposed in the housing 10. The housing 10 includes a top plate 11, two tracks 12, an elastic element 13, a first clamping element 14, and a connecting plate 15. The tracks 12, the elastic element 13, and the first clamping element 14 are disposed on the top plate 11. Moreover, the tracks 12, the elastic element 13, the first clamping element 14, and the top plate 11 are formed as a single piece.

In one embodiment, the material of the two tracks 12, the elastic element 13, the first clamping element 14, and the top plate 11 can be plastic, and can be made by injection molding. The three parts, the housing 10, the sliding structure 20, and the switch structure 30, are assembled together to form the mounting device 1 of the embodiment. The housing 10 is integrated with an electronic device. Therefore, the assembly steps are simplified and the production cost is reduced.

Referring to FIG. 2, the top plate 11 includes an opening 111. The tracks 12 are elongated structures and extend in a detaching direction D1. The tracks 12 are adjacent to opposite sides of the opening 111, and parallel to each other. The elastic element 13 is in the opening 111 and between the two tracks 12. The elastic element 13 includes an elastic arm 131 and a blocking rib 132. The elastic arm 131 is connected to one side of the opening 111 and is in the opening 111. The elastic arm 131 extends in a mounting direction D2. In this embodiment, the mounting direction D2 is opposite to the detaching direction D1. The blocking rib 132 is disposed on the upper surface of the elastic arm 131 and extends perpendicular to the detaching direction D1. In this embodiment, the blocking rib 132 protrudes over the opening 111 and is between the two tracks 12.

The first clamping element 14 is connected to the two tracks 12. The first clamping element 14 is an elongated structure and extends perpendicular to the detaching direction D1. The connecting plate 15 is connected to the two tracks 12 and the first clamping element 14. The first clamping element 14 is an L-shaped structure. A first clamping groove 141 is formed among the first clamping element 14, the tracks 12, and the connecting plate 15. When the mounting device 1 is mounted on the support frame T1, one edge of the horizontal board T10 is in the first clamping groove 141 and makes contact with the connecting plate 15.

Figure 4:
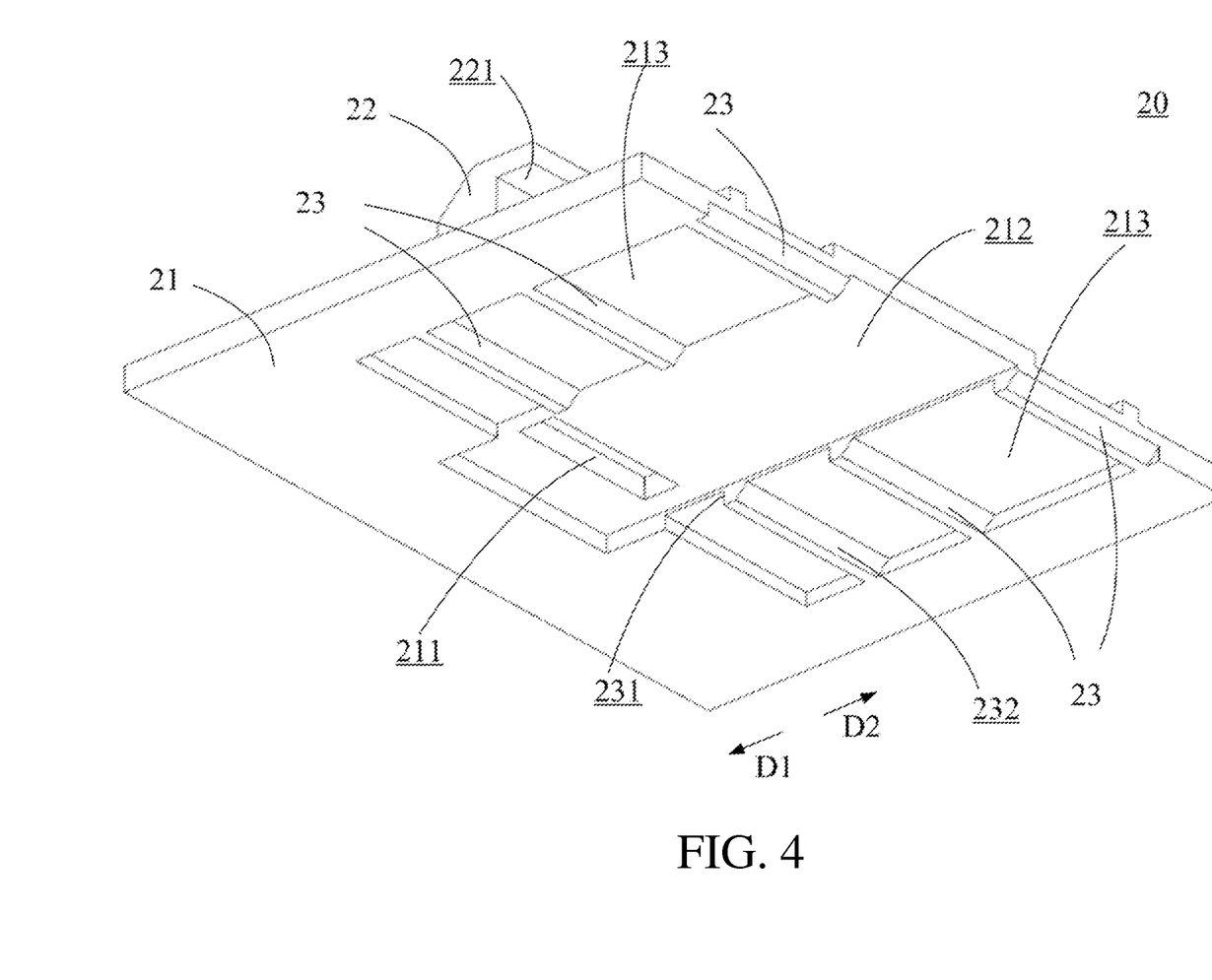
FIG. 4 is a perspective view of the sliding structure of the mounting device of FIG. 1.

FIG. 4 is a perspective view of the sliding structure 20 of FIG. 1. The sliding structure 20 is movably disposed in the two tracks 12. The tracks 12 restrict the sliding structure 20 from moving in the detaching direction D1 or in the mounting direction D2. The sliding structure 20 includes a first plate 21, a second clamping element 22, and reverse ribs 23.

Opposite sides of the first plate 21 are movably disposed in the two tracks 12 and contact the top plate 11. The first plate 21 has a first insertion opening 211, a guiding groove 212, and two receiving grooves 213. The first insertion opening 211 is formed on the upper surface of the first plate 21. The first insertion opening 211 may be elongated and extends perpendicular to the detaching direction D1. The guiding groove 212 is formed on the lower surface of the first plate 21. The guiding groove 212 may be elongated and extends in the detaching direction D1. The receiving groove 213 is formed on the lower surface of the first plate 21, and the guiding groove 212 is between two receiving grooves 213. The lower surface of the first plate 21 faces the switch structure 30 and the top plate 11. In this embodiment, the guiding groove 212 is in communication with the first insertion opening 211 and two receiving grooves 213. The depth of the guiding groove 212 is deeper than the depth of the receiving groove 213. These depths are measured in the same direction, which is perpendicular to the detaching direction D1.

The second clamping element 22 is connected to the upper surface of the first plate 21. The second clamping element 22 may be elongated and extends perpendicular to the detaching direction D1. The second clamping element 22 may be an L-shaped structure. A second clamping groove 221 is formed between the second clamping element 22 and the first plate 21. In this embodiment, the heights of the first clamping element 14 and the second clamping element 22 relative to the top plate 11 are greater than the height of the track 12 relative of the top plate 11. When the mounting device 1 is mounted on the support frame T1, one edge of the horizontal board T10 is in the second clamping groove 221.

The reverse ribs 23 are disposed on the lower surface of the first plate 21. In this embodiment, the reverse ribs 23 are disposed in the receiving grooves 213 of the first plate 21. The reverse ribs 23 are elongated and extend perpendicular to the detaching direction D1. In other words, the reverse ribs 23 are parallel to each other. Moreover, each receiving groove 213 has the same number of reverse ribs 23.

Figure 5:
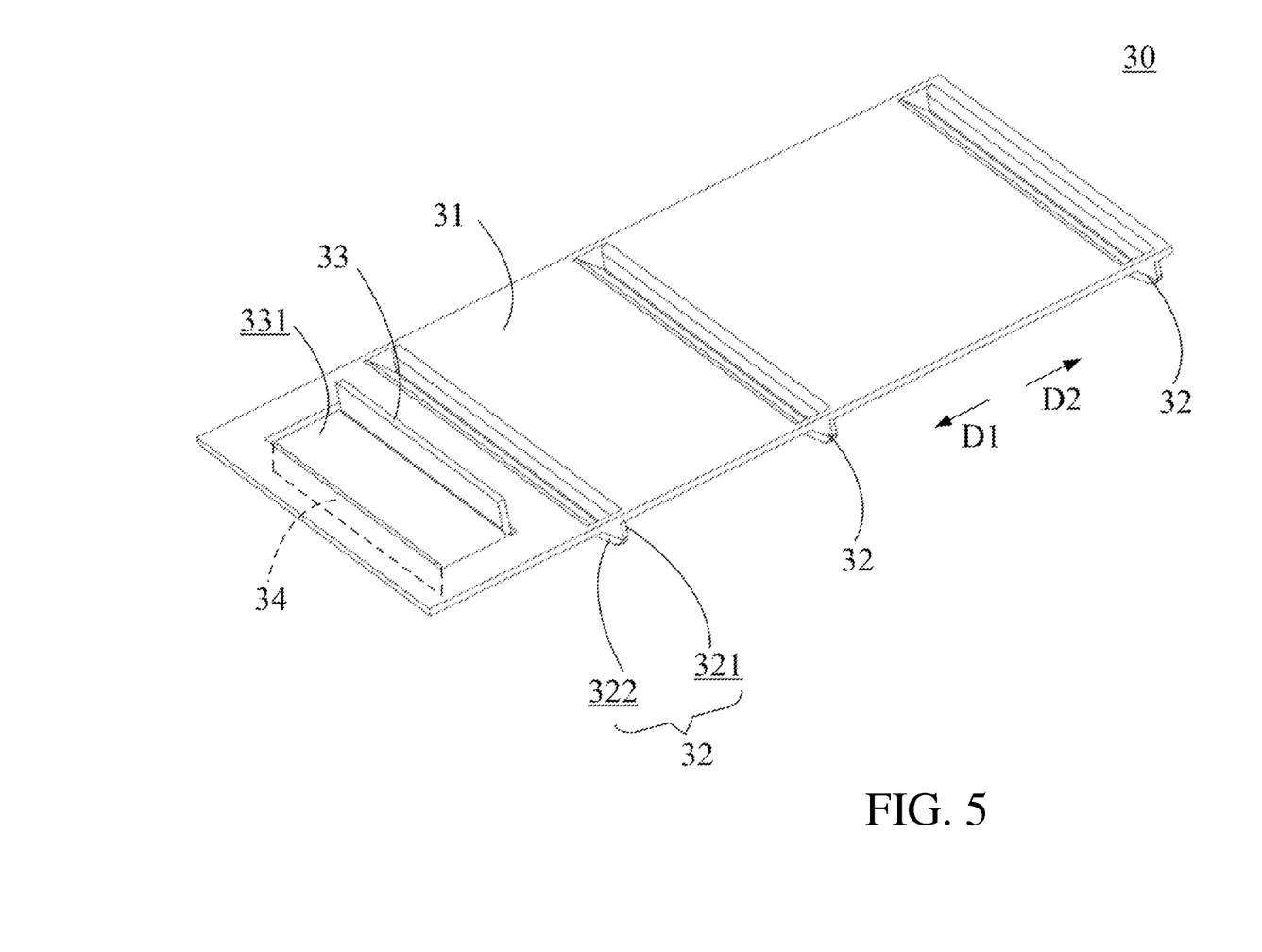
FIG. 5 is a perspective view of the switch structure of the mounting device of FIG. 1.

FIG. 5 is a perspective view of the switch structure 30 of FIG. 1. The switch structure 30 is movably disposed on the first plate 21. The switch structure 30 includes a second plate 31, forward ribs 32, a limiting element 33, and a blocking plate 34. The second plate 31 is movably disposed in the guiding groove 212 and contacts the top plate 11. In other words, the second plate 31 is between the first plate 21 and the top plate 11. The second plate 31 is elongated and extends in the detaching direction D1. In this embodiment, the second plate 31 is parallel to the first plate 21. The second plate 31 includes a second insertion opening 311.

The forward ribs 32 are disposed on the lower surface of the second plate 31. The forward ribs 32 are elongated and extend perpendicular to the detaching direction D1. In other words, the forward ribs 32 are parallel to each other, and arranged on the lower surface of the second plate 31 in the detaching direction D1. In this embodiment, the blocking rib 132, the reverse ribs 23, and the forward ribs 32 are on the same plane and extend perpendicular to the detaching direction D1.

The limiting element 33 is disposed on the upper surface of the second plate 31. The limiting element 33 is adjacent to the second insertion opening 311, and in the first insertion opening 211. In this embodiment, the limiting element 33 is perpendicular to the second plate 31. The limiting element 33 is an elongated structure and extends perpendicular to the detaching direction D1. The blocking plate 34 is disposed on the lower surface of the second plate 31 and is adjacent to the second insertion opening 311. In this embodiment, the limiting element 33 is perpendicular to the second plate 31. The limiting element 33 is an elongated structure, and extends perpendicular to detaching direction D1.

As shown in FIG. 1 and FIG. 2, the mounting device 1 is mounted on the support frame T1, and the sliding structure 20 and the switch structure 30 are as installed. The support frame T1 is fastened between the first clamping element 14 and the second clamping element 22, and the blocking rib 132 blocks one reverse rib 23, to restrict the sliding structure 20 from moving relative to the housing 10.

As shown in FIG. 3 to FIG. 5, when the horizontal board T10 is fastened between the first clamping element 14 and the second clamping element 22, the horizontal board T10 is on the tracks 12 and the connecting plate 15, and the vertical board T20 is between the first clamping element 14 and the second clamping element 22.

In this embodiment, the blocking rib 132 includes a main vertical plane 133 and a main slope 134. Each reverse rib 23 includes a first vertical plane 231 and a reverse slope 232. Each forward rib 32 includes a second vertical plane 321 and a forward slope 322. When the sliding structure 20 is as installed, one reverse rib 23 and one forward rib 32 are arranged and extend along a line, which is perpendicular to the detaching direction D1. The main vertical plane 133 of the blocking rib 132 faces the reverse slope 232 of the reverse rib 23 and the forward slope 322 of the forward rib 32.

Figure 6:
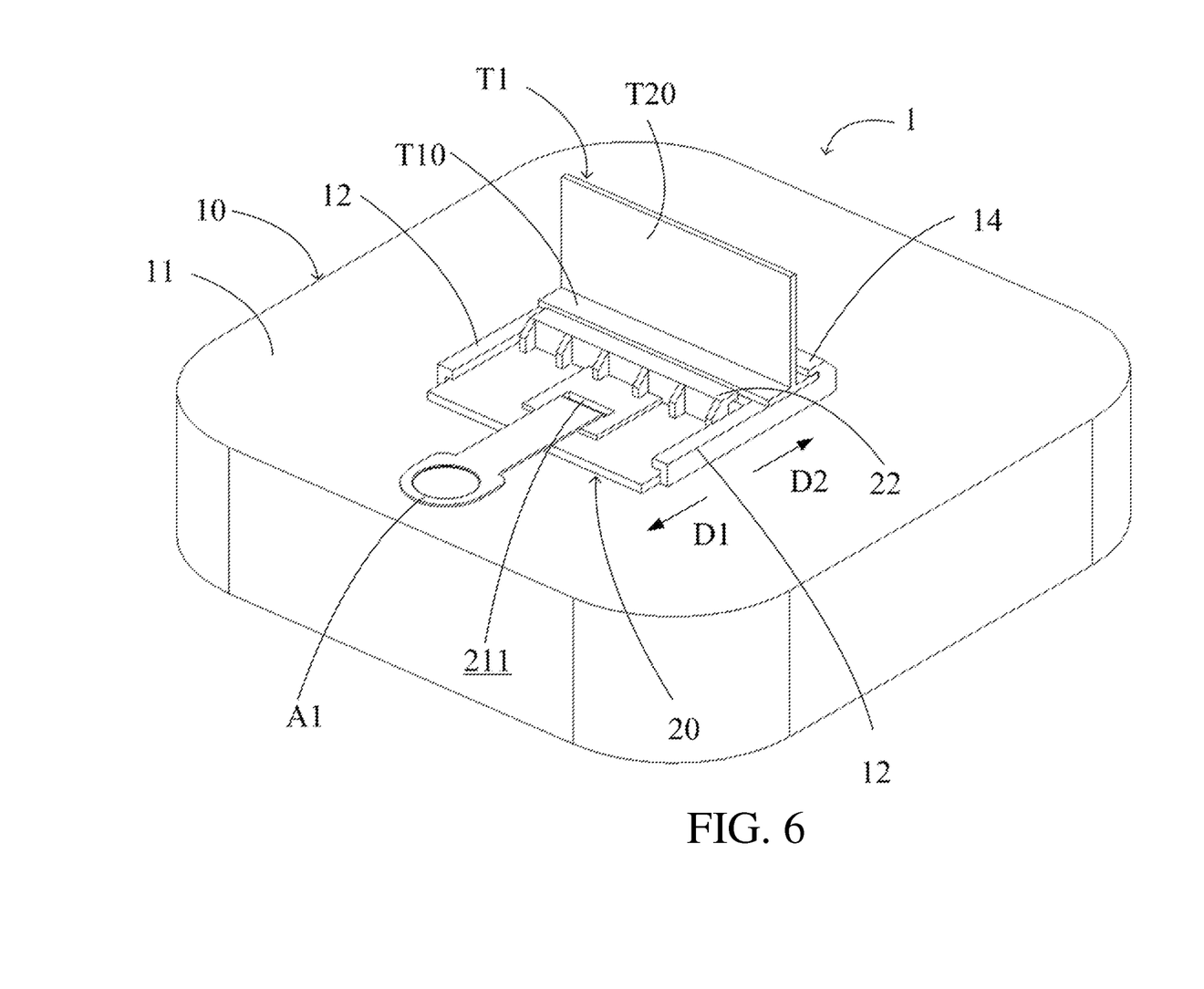
FIG. 6 is a perspective view of the mounting device, wherein the sliding structure allows detachment.

FIG. 6 is a perspective view of the mounting device 1, wherein the sliding structure 20 is in a position for detachment. When the mounting device 1 is removed from the support frame T1, a tool A1 can be used to hook and pull the sliding structure 20 in the detaching direction D1 to keep the second clamping element 22 away from the support frame T1. Thereby, the mounting device 1 can be easily removed from the support frame T1.

Figure 7:
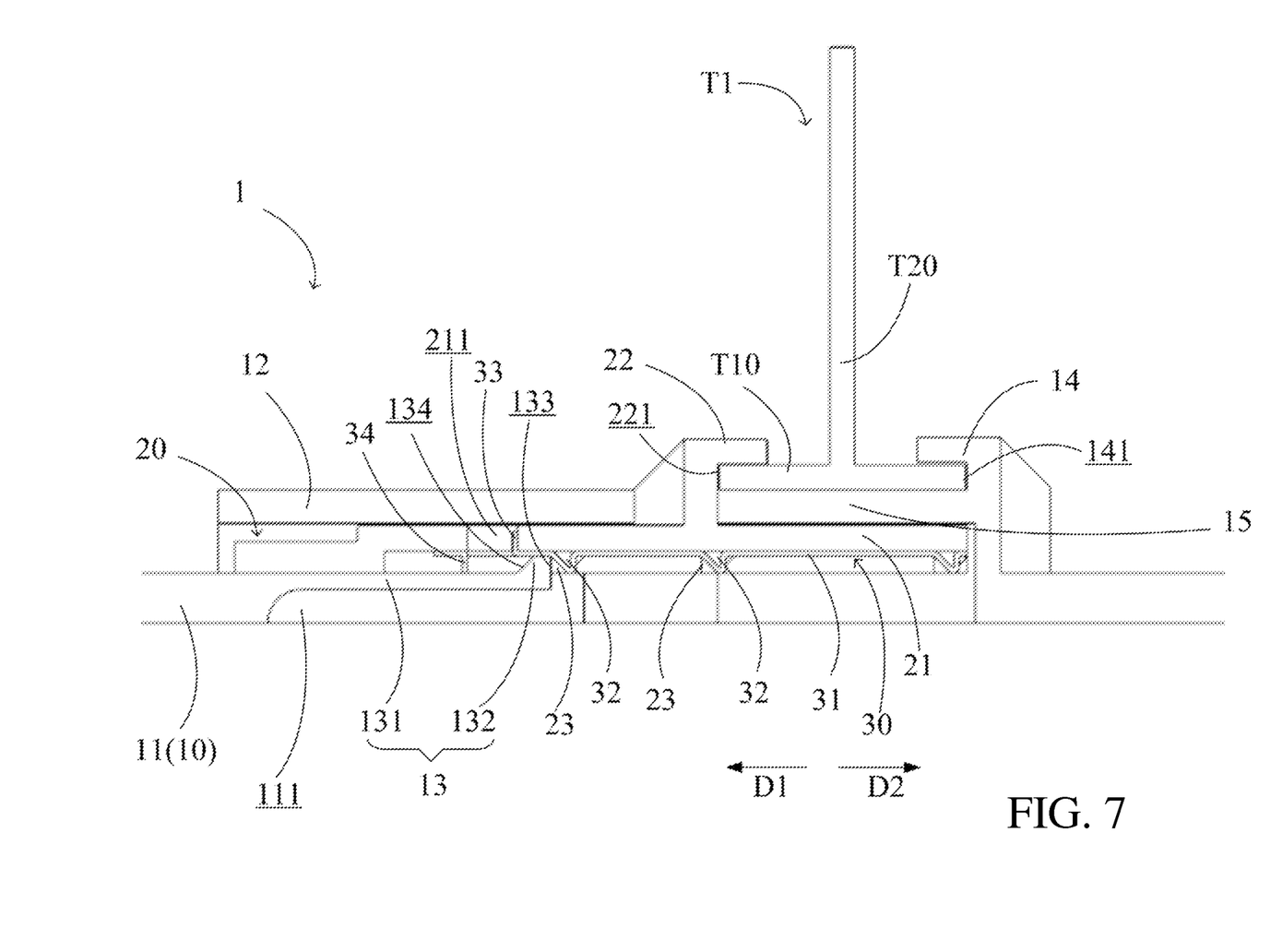
FIG. 7 is a cross-sectional view of line BB of FIG. 1.
Figure 8:
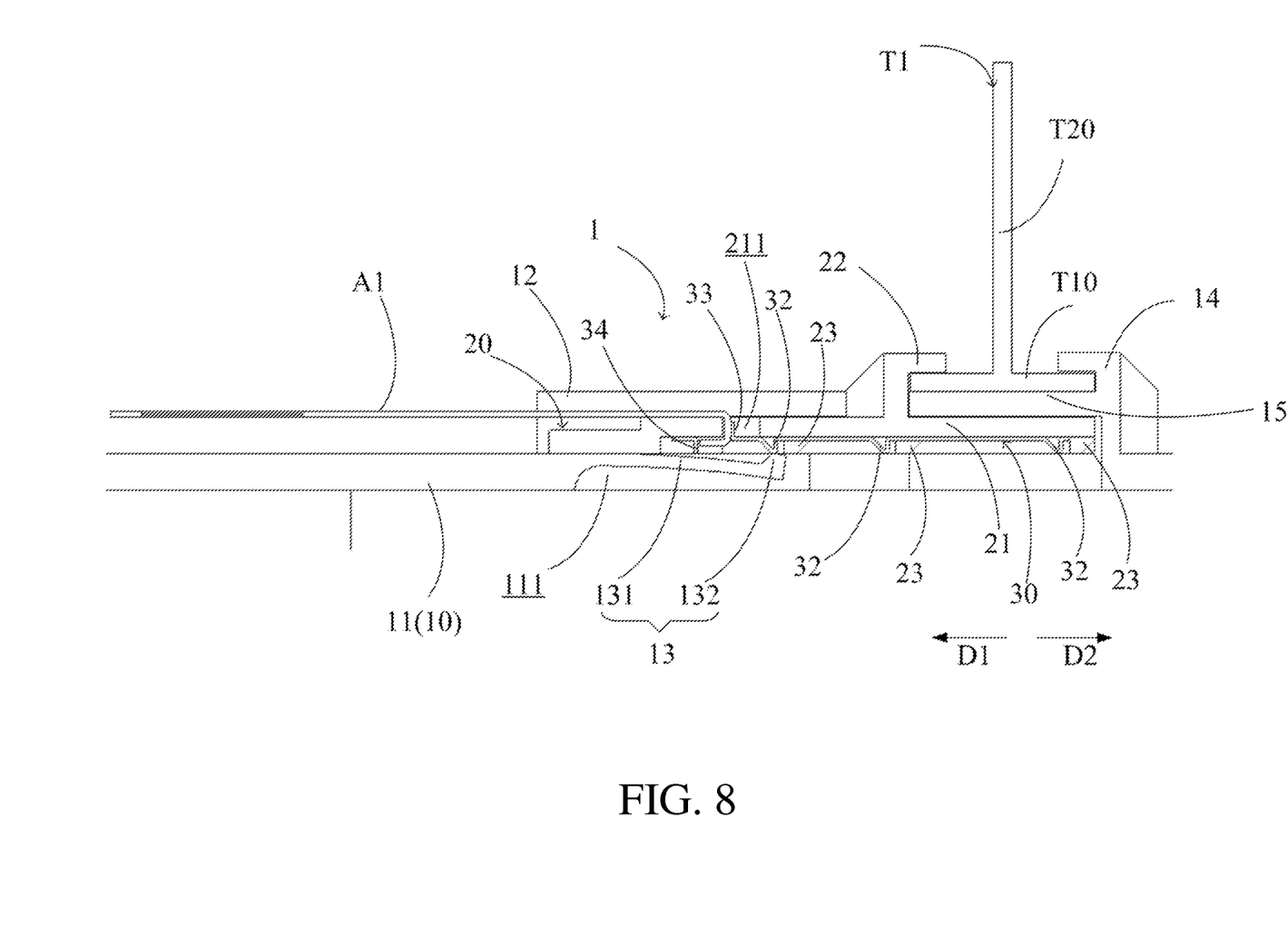
FIG. 8 and FIG. 9 show intermediate stages of detaching the mounting device from the support frame.
Figure 9:
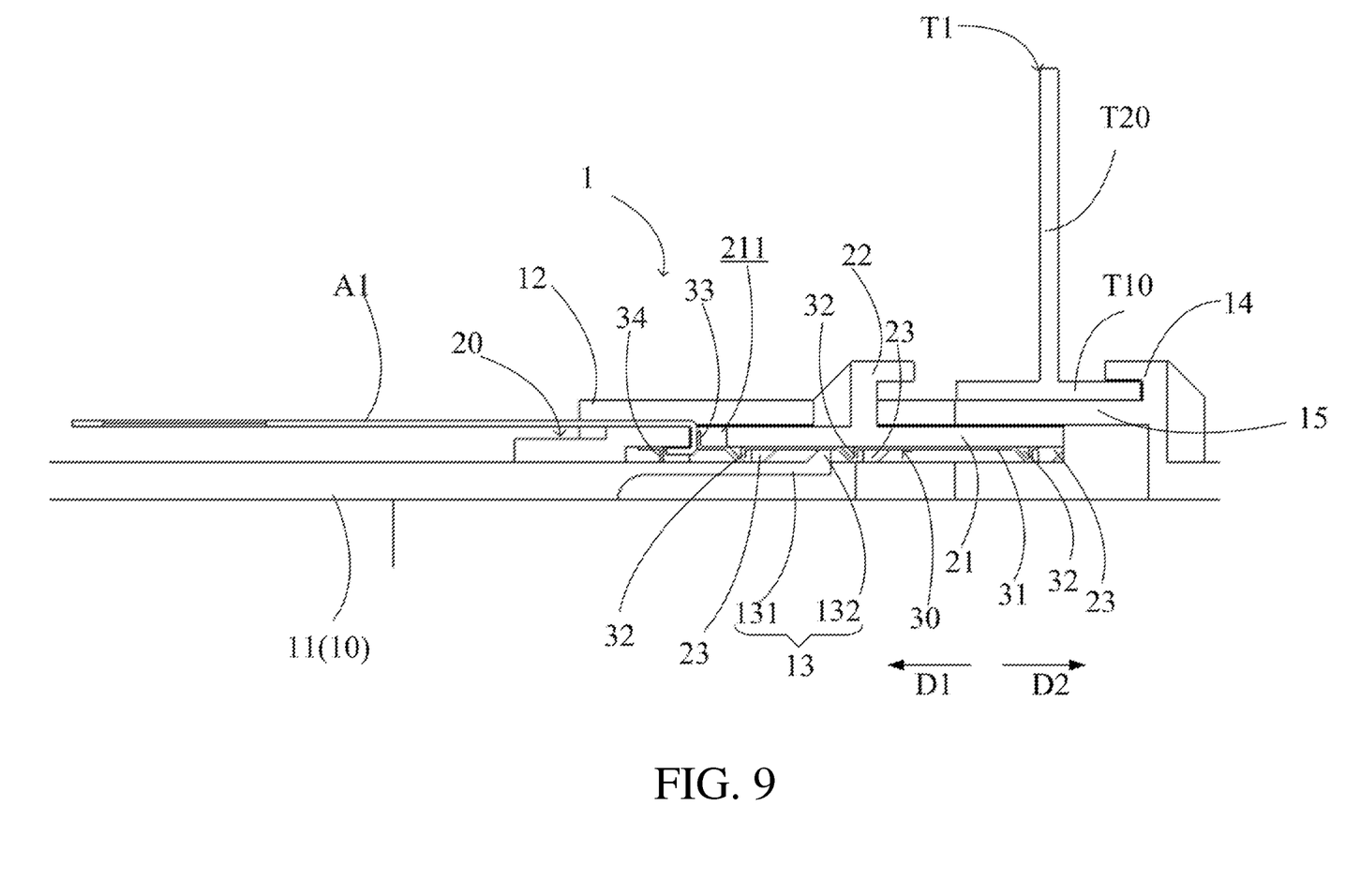

FIG. 7 is a cross-sectional view of line BB of FIG. 1. FIG. 8 and FIG. 9 show intermediate stages of detaching the mounting device 1 from the support frame T1. As shown in FIG. 7, the mounting device 1 is mounted on the support frame T1, and the sliding structure 20 and the switch structure 30 are as installed. Moreover, the limiting element 33 is in a first side of the first insertion opening 211, wherein the first side is adjacent to the first clamping element 14.

As shown in FIG. 8, the end of the tool A1 is inserted into the first insertion opening 211 and the second insertion opening 311 (as shown in FIG. 5), and the tool pulls the blocking plate 34 in the detaching direction D1, so as to move the switch structure 30 in the detaching direction D1 to a switch position. In this embodiment, the end of the tool A1 is a U-shaped structure. As the switch structure 30 is moved in the detaching direction D1 to the switch position, the forward slope 322 of the forward rib 32 of the switch structure 30 slides along the blocking rib 132 and pushes the blocking rib 132 down, to separate the blocking rib 132 from the reverse rib 23. At this time, the blocking rib 132 allows the reverse rib 23 of the sliding structure 20 to move in the detaching direction D1 through the blocking rib 132. Moreover, the limiting element 33 is in a second side of the first insertion opening 211 and abuts the tool A1. The second side is farther away from the first clamping element 14 than the first side.

As shown in FIG. 9, when the tool A1 continues to move in the detaching direction D1, the second clamping element 22 is far away from the support frame T1, thus the mounting device 1 can be easily removed from the support frame T1.

In addition, in this embodiment, a specific tool A1 is required to remove the mounting device 1 from the support frame T1, which reduces the chance of mounting device 1 being lost. In another embodiment, the tool A1 can be integrated into the sliding structure 20 and the switch structure 30 to facilitate rapid removal or installation of the mounting device 1.

As shown in FIG. 9, when the mounting device 1 is mounted on the support frame T1, the tool A1 can be moved in the mounting direction D2. At this time, the end of the tool A1 pushes the limiting element 33, so as to move the limiting element 33 from the first side of the first insertion opening 211 to the second side. As the tool A1 continues to move in the mounting direction D2, the reverse rib 23 and the forward slope 322 of the forward rib 32 move along the main slope 134 of the blocking rib 132, and push the blocking rib 132 down, thereby allowing the reverse rib 23 and the forward rib 32 to pass through the blocking rib 132 to the installed position, as in FIG. 7. Therefore, the mounting device 1 can be easily mounted on the support frame T1. Moreover, since the limiting element 33 is on the first side of the first insertion opening 211, the tool A1 can be removed from the mounting device 1 through the first insertion opening 211.

Figure 10:
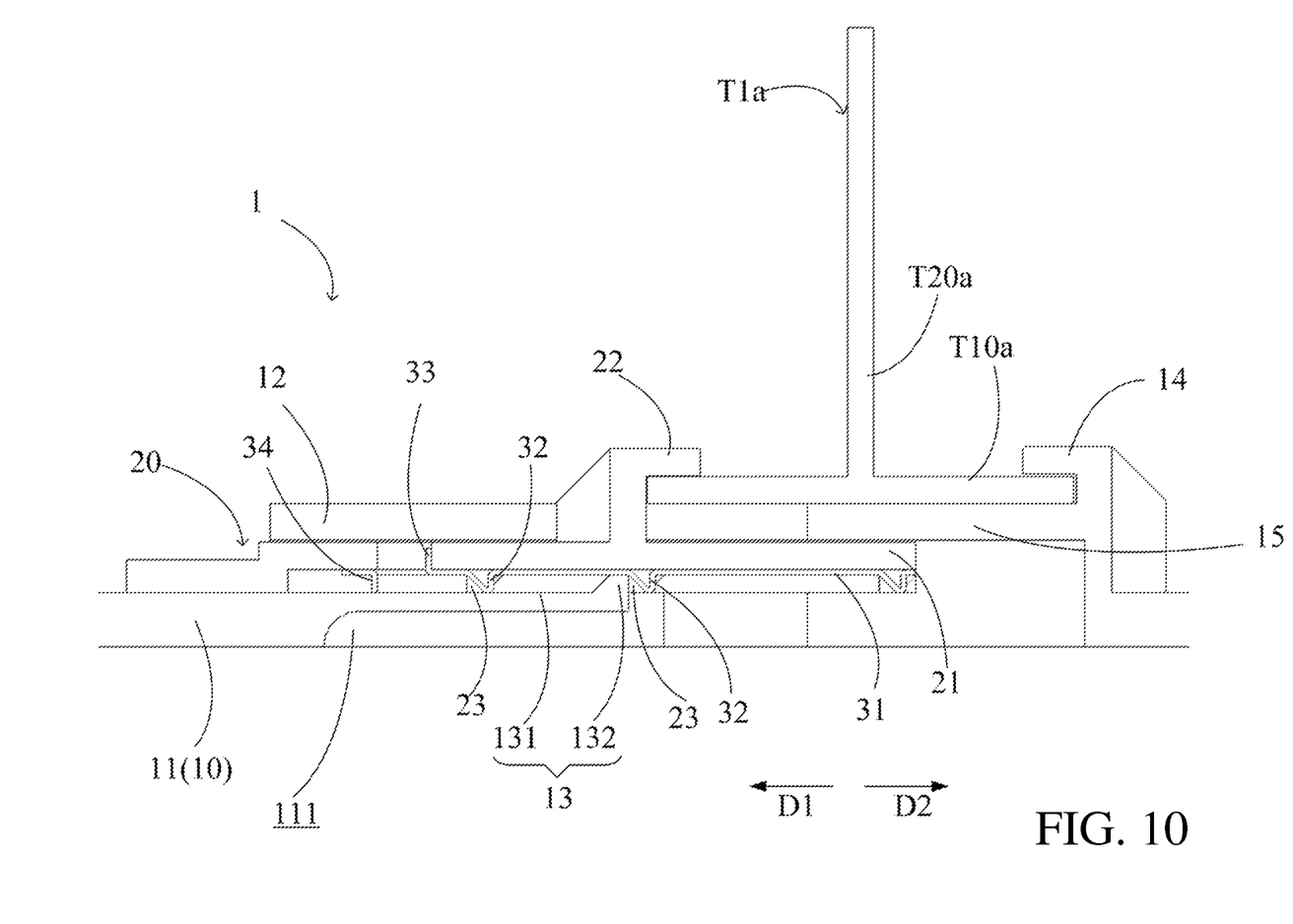
FIG. 10 shows the mounting device of FIG. 1 mounted on another support frame of a different size.

FIG. 10 shows the mounting device 1 of FIG. 1 mounted on another support frame T1a which is of a different size. In this embodiment, the width of the horizontal board T10a of the support frame T1a is greater than the width of the horizontal board T10 of the support frame T1. Since the sliding structure 20 has multiple reverse ribs 23 arranged in parallel, and the switch structure 30 has multiple forward ribs 32 arranged in parallel, the blocking rib 132 can abut the corresponding reverse rib 23 to limit the sliding structure 20 relative to the housing 10. Therefore, the mounting device 1 can be mounted on different sizes of support frame T1a.

The mounting device of the present disclosure includes only three parts: the housing, the sliding structure, and the switch structure, thus the assembly steps are simplified and the production cost is reduced. Moreover, the steps of mounting and detaching can be completed by moving the sliding structure, which reduces the difficulty in mounting and detaching. In addition, the mounting device can be mounted on support frames of different sizes by the reverse ribs and the forward ribs, which are arranged in parallel.

Many details are often found in the relevant art, thus many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A mounting device, comprising:
   a housing comprising:
      two tracks;
      an elastic element comprising a blocking rib; and
      a first clamping element;
   a sliding structure movably disposed in the tracks, and comprising:
      a first plate;
      a second clamping element connected to an upper surface of the first plate; and
      a reverse rib connected to a lower surface of the first plate; and
   a switch structure movably disposed on the first plate, and comprising a forward rib; wherein
   when the sliding structure is in an installation position, a support frame is fastened between the first clamping element and the second clamping element, and the blocking rib blocks the reverse rib, to restrict the sliding structure from moving relative to the housing, and
   when the switch structure is moved in a detaching direction, the forward rib pushes the blocking rib away from the reverse rib, to allow the sliding structure moving in the detaching direction relative to the housing.

2. The mounting device as claimed in claim 1, wherein the housing comprises a top plate, and the top plate comprises an opening,
   the tracks, the elastic element, and the first clamping element disposed on the top plate,
   the elastic element is in the opening and between the tracks, and
   the first clamping element is connected to the tracks.

3. The mounting device as claimed in claim 2, wherein heights of the first clamping element and the second clamping element relative to the top plate are greater than a height of the tracks relative to the top plate.

4. The mounting device as claimed in claim 1, wherein the blocking rib comprises a main vertical plane and a main slope,
   the reverse rib comprises a first vertical plane and a reverse slope, and
   the forward rib comprises a second vertical plane and a forward slope,
   wherein when the sliding structure is in the installation position, the main vertical plane faces the reverse slope and the forward slope.

5. The mounting device as claimed in claim 1, wherein when the sliding structure is in the installation position, the blocking rib, the reverse rib, and the forward rib are on the same plane, and extend perpendicular to the detaching direction.

6. The mounting device as claimed in claim 1, wherein the first plate comprises a guiding groove, and a receiving groove in communication with the guiding groove, and the switch structure comprises a second plate movably disposed in the guiding groove, wherein the reverse rib is disposed in the receiving groove and the forward rib is disposed on a lower surface of the second plate.

7. The mounting device as claimed in claim 6, wherein the first plate comprises a first insertion opening, the switch structure comprises a limiting element disposed on the second plate, and in the first insertion opening.

8. The mounting device as claimed in claim 7, wherein the second plate comprises a second insertion opening, and
the switch structure comprises a blocking plate disposed on the lower surface of the second plate, and adjacent to the second insertion opening,
wherein when a tool pushes the blocking plate via the first insertion opening and the second insertion opening, the switch structure is moved to the detaching direction.

9. The mounting device as claimed in claim 1, wherein the support frame comprises a horizontal board, and a vertical board connected to a center of the horizontal board, the horizontal board and the vertical board extend perpendicular to the detaching direction,
wherein when the horizontal board is fastened between the first clamping element and the second clamping element, the horizontal board is on the tracks, and the vertical board is between the first clamping element and the second clamping element.

10. The mounting device as claimed in claim 1, wherein the housing is a housing of an electronic device, and the support frame is a T-shaped structure, mounted on a ceiling.

\* \* \* \* \*